(12) United States Patent  (10) Patent No.: US 7,593,211 B2
Maclennan et al.  (45) Date of Patent: Sep. 22, 2009

(54) AUTOMATICALLY CONFIGURING VACUUM CONTACTOR

(75) Inventors: David Scott S. Maclennan, Ayr (CA); Reginald Albert A. Drake, Bright (CA)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 90 days.

(21) Appl. No.: 11/844,879

(22) Filed: Aug. 24, 2007

(65) Prior Publication Data

US 2009/0052107 A1 Feb. 26, 2009

(51) Int. Cl.
*H01H 47/00* (2006.01)
(52) U.S. Cl. .................................. 361/160; 361/139
(58) Field of Classification Search ................ 361/139, 361/143, 146, 160; 218/118, 124
See application file for complete search history.

(56) References Cited

U.S. PATENT DOCUMENTS

| 3,708,638 | A | * | 1/1973 | Mitchell | 218/118 |
| 6,156,989 | A | | 12/2000 | Miller et al. | |
| 2006/0126257 | A1 | * | 6/2006 | Domo et al. | 361/139 |
| 2007/0115604 | A1 | * | 5/2007 | Zettel et al. | 361/160 |

* cited by examiner

*Primary Examiner*—Danny Nguyen
(74) *Attorney, Agent, or Firm*—Boyle Fredrickson LLP; Alexander R. Kuszewski

(57) ABSTRACT

A controller for a vacuum contactor or the like measures barometric pressure and provides a short impedance characterizing pulse to the coils of the vacuum contactor coils to assess proper operating conditions of the coils and to check for coil or sensor faults.

20 Claims, 3 Drawing Sheets

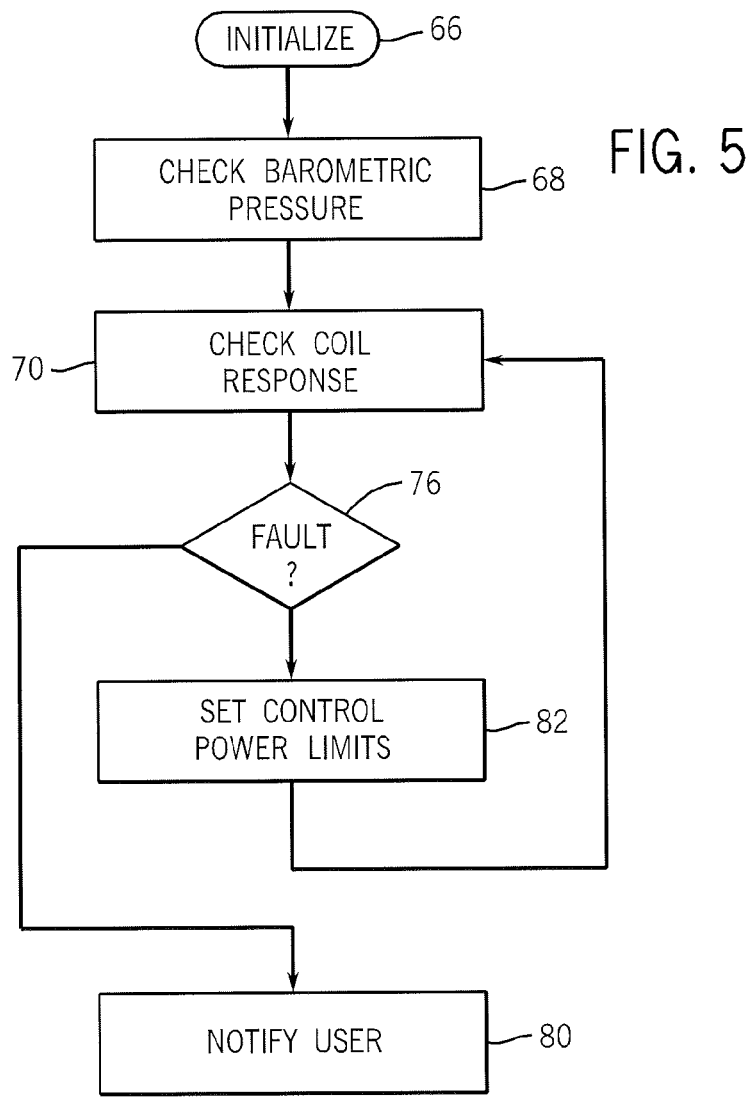

AUTOMATICALLY CONFIGURING VACUUM CONTACTOR

CROSS-REFERENCE TO RELATED APPLICATIONS

STATEMENT REGARDING FEDERALLY SPONSORED RESEARCH OR DEVELOPMENT

BACKGROUND OF THE INVENTION

The present invention relates to electromagnetically controlled switches, such as relays and contactors, and in particular to an improved controller for vacuum contactors.

Vacuum contactors are electrically controlled switches used for interrupting high power circuits. In a vacuum contactor, a pair of contacts are enclosed inside a vacuum-tight bottle. One of the contacts is fixed to an end of the bottle and the other contact may be moved by means of a bellows toward and away from the fixed contact under the influence of an electrical solenoid. The vacuum surrounding the contacts helps suppress an arc formed when a circuit is interrupted.

"Electrically-held" vacuum contactors, as the name suggests, hold the contacts in a closed position by continuously applying a holding current applied to the electrical solenoid. Typically this holding current is much less than the current used to close or pull in the contacts when the switch is actuated. "Mechanically-latched" vacuum contactors hold the contacts in the closed position by a mechanical latch, eliminating the need for a holding current. A second solenoid releases the mechanical latch when it is desired to open the contacts.

The bellows that allows movement of one of the contacts applies a biasing force on that contact that is a combination of the spring force required to flex the bellows and resist closure of the contacts and the force of atmospheric pressure across the bellows tending to move the contacts together. An external spring may be used to balance these forces with the contacts open.

This balance of forces is upset if the vacuum contactor is moved to a different altitude having a different atmospheric pressure. For this reason, it is know to provide an external spring that is replaceable or adjustable according to the altitude. Alternatively, it is known to adjust the pull-in and/or holding current of the electrical solenoid to compensate for any force unbalance. This adjustment is performed by means of a table and a set of switches that may be set by the user.

Larger vacuum bottle and contact sets may be used for greater power handling. These larger vacuum bottles require greater actuation forces that are normally accommodated by larger solenoid coils. These larger coils require different actuation currents and holding currents.

Operation of a vacuum contactor is normally mediated by a contactor controller providing regulated control of the power applied to the vacuum contactor solenoids adjusted by the user for solenoid coil size and/or altitude. Configuration of the contactor controller for different vacuum contactors and altitudes is complex and time consuming.

BRIEF SUMMARY OF THE INVENTION

The present invention provides a contactor controller that may automatically configure itself for a wide variety of vacuum contactor types and operating altitudes. At initialization, the contactor controller interrogates the electrical characteristics of the attached coils of the vacuum contactor using a short pulse. The pulse power is selected to be sufficient to distinguish the impedance of the coil without activating the coil. The results of these measurements are used to determine the proper operating conditions of the coil and, in particular, the necessary coil actuation power. A barometric pressure sensor also may be used to further automatically adjust the operating condition for altitude. This coil measurement may also be used for ongoing fault detection.

Underpinning this invention is the inventor's recognition that even minor errors in the configuration of the contactor controller for a vacuum contactor can contribute to premature failure of the vacuum contactor by over stressing of the vacuum bottle.

Specifically, the present invention provides an electronic controller for an electromagnetically controlled electrical switch. The controller includes a coil power source providing connection points to at least one coil of the switch, and a test circuit provides an electrical pulse to the coil and monitors electrical flow to the coil to differentiate between at least two sizes of coil. A coil power source controller receives an actuation signal to provide power to the coil through the coil power source, where the power to the coil is automatically selected according to the size of coil determined by the test circuit.

It is thus a feature of one embodiment of the invention to provide a controller that automatically configures itself for a variety of different electromagnetically actuated switches. It is another feature of an embodiment of the invention to provide a controller that better tailors actuation currents to the coils of vacuum contactors to reduce premature failure of the vacuum bottles of such controllers that may be caused by excessive flexure of the vacuum bottles under excessive actuation force.

The test circuit may differentiate between sizes of coils by monitoring current flow after a predetermined period of time under application of a pulse of known voltage to the coil.

It is thus a feature of one embodiment of the invention to provide a simple method of distinguishing coil types using an inherent quality of the coil and that thus does not require a machine-readable labeling of the coils.

The pulse of known voltage and predetermined time may be selected to prevent activation of the electromagnetically controlled electrical switch for the coil sizes.

It is thus a feature of one embodiment of the invention that it provides a testing mechanism that provides discrimination among coil types without inadvertent activation of equipment or devices attached to the vacuum contactor.

The electronic controller may further include a barometric pressure sensor and the coil power source controller may receive a pressure signal from the barometric sensor to provide power to the coil based on the barometric pressure.

It is thus a feature of one embodiment of the invention to automate the adjustment of control current for each different coil type according to the altitude of the vacuum contactor, thereby allowing more accurate correction.

The power to the coil may be adjusted with barometric pressures according to a function unique to the deduced coil type.

It is thus a feature of one embodiment of the invention to permit sophisticated, empirically derived power adjustments unique to a particular coil, providing superior coil actuation.

The coil power source controller may further detect a fault condition and generate a fault signal based on electrical flow to the coil.

It is thus another feature of one embodiment of the invention to employ the same mechanism used to set coil power to provide an additional functionality of fault detection.

A fault signal may be based on electrical flow to the coil under a predetermined value indicating a missing coil or electrical flow to the coil exceeding a predetermined amount indicating a shorted coil, or electrical flow to the coil exceeding a predetermined difference from current flow expected of known coils, indicating an unknown coil. Each of these conditions may be distinguished to the user.

It is thus a feature of one embodiment of the invention to provide for multiple types of fault detection.

The electronic controller may employ the controllable power source to deliver the electrical pulse to the coil.

It is thus another feature of one embodiment of the invention to make use of existing hardware for the purpose of characterizing the coil configuration. By controlling the same power supply used to provide power to the activation solenoids, the need for separate test circuit and isolation is eliminated.

These particular features and advantages may apply to only some embodiments falling within the claims and thus do not define the scope of the invention.

BRIEF DESCRIPTION OF THE DRAWINGS

FIG. 5 is a flow chart of a program executed by the microcontroller of FIG. 3 implementing the present invention; and FIG. 6 is a fragmentary diagram of a lookup table employed by the microcontroller of FIG 3.

DETAILED DESCRIPTION OF THE INVENTION

Figure 1:
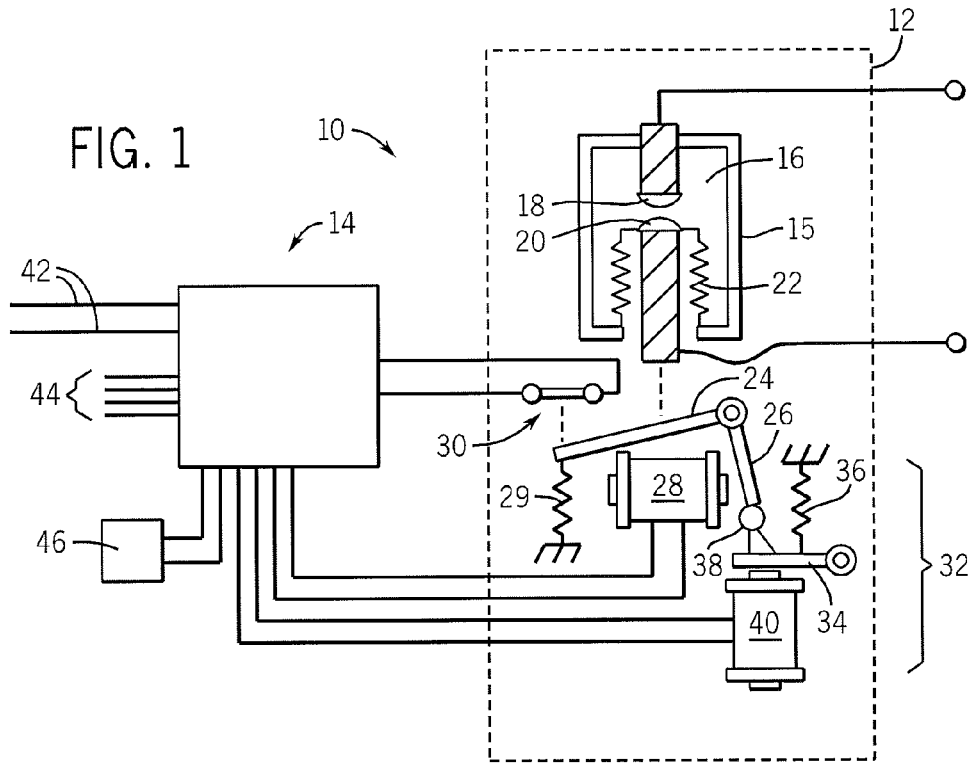
FIG. 1 is a diagram showing the controller of the present invention as connected to a vacuum contactor, with the vacuum contactor in an open state.

Referring now to FIG. 1, a vacuum contactor system 10, providing an example electromechanical switch system suitable for use with the present invention, includes a vacuum contactor 12 and a vacuum contactor controller 14.

As is generally understood in the art, the vacuum contactor 12 may include one or more vacuum bottles 15 providing a sealed evacuated chamber 16. Within the chamber 16 are two contacts: a stationary contact 18 fixed with respect to the vacuum bottle 15, and a movable contact 20 attached to the vacuum bottle 15 by means of a bellows 22.

The bellows 22 allows axial motion of the movable contact 20 toward and away from the stationary contact 18 under the influence of a pivoting armature 24 attached to the movable contact 20 through a biasing spring (not shown).

The armature 24 is raised or lowered by attraction between an armature tab 26 and a pole of a first electromagnet 28. In operation, the armature 24 is moved to a lowered position, separating the contacts 18 and 20, under the urging of a biasing spring 29 and is moved to a raised position by the attraction of the tab 26 to the electromagnet 28 when the electromagnet is energized. A raising of the armature 24 also opens a normally closed auxiliary contact 30 outside the vacuum bottle 15.

Each of these assemblies of vacuum contactor 12 may be duplicated for multiphase circuits. For multiphase circuits, the several vacuum bottles may be actuated by a common armature 24.

Figure 2:
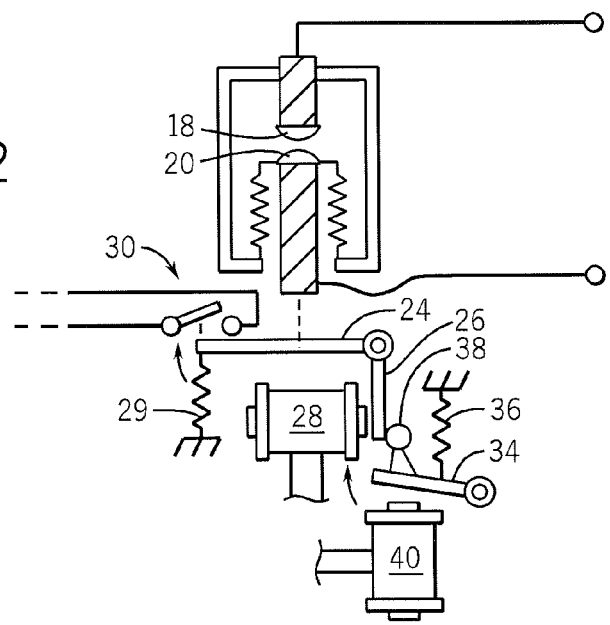
FIG. 2 is a fragmentary view of FIG. 1 showing the vacuum contactor in a closed state and mechanically latched.

In a mechanically latched vacuum contactor 12, an optional armature latch assembly 32 may be added. The armature latch assembly 32 includes a pivoting armature latch 34 which, in a lowered state (as shown in FIG. 1), allows free movement of the armature tab 26 toward the electromagnet 28 to close the contacts 18 and 20. Referring now to FIG. 2, when the armature tab 26 is adjacent the pole piece of the electromagnet 28, the armature latch 34 rises as pulled by spring 36 allowing a roller 38 to capture the armature tab 26 against the pole of the electromagnet 28. The roller 38, held by the spring 36 retains the armature 24 upward with contacts 18 and 20 and auxiliary contacts 30 open. In this latched position of FIG. 2, no power is required in electromagnet 28 to hold contacts 18 and 20 and auxiliary contacts 30 open.

Release of the armature 24 from the mechanical latching, and opening of contacts 18 and 20 and closing auxiliary contacts 30 is effected by a release electromagnet 40 that, when activated, draws the armature latch 34 downward pulling roller 38 away from armature tab 26 and allowing the armature tab 26 to move away from electromagnet 28 as shown again in FIG. 1.

Referring still to FIG. 1, a vacuum contactor 12 is normally connected to a vacuum contactor controller 14 which is connected to receive a switch signal from the auxiliary contacts 30 and which provides power leads to electromagnets 28 and 40 (for a mechanically latched vacuum contactor 12) and to electromagnet 28 only (for an electrically held vacuum contactor 12). The vacuum contactor controller 14 may also connect to one or more serial communication channels 42 and to one or more analog or digital input output (I/O) lines 44. The vacuum contactor controller 14 may also connect to a barometric pressure sensor 46.

Figure 3:
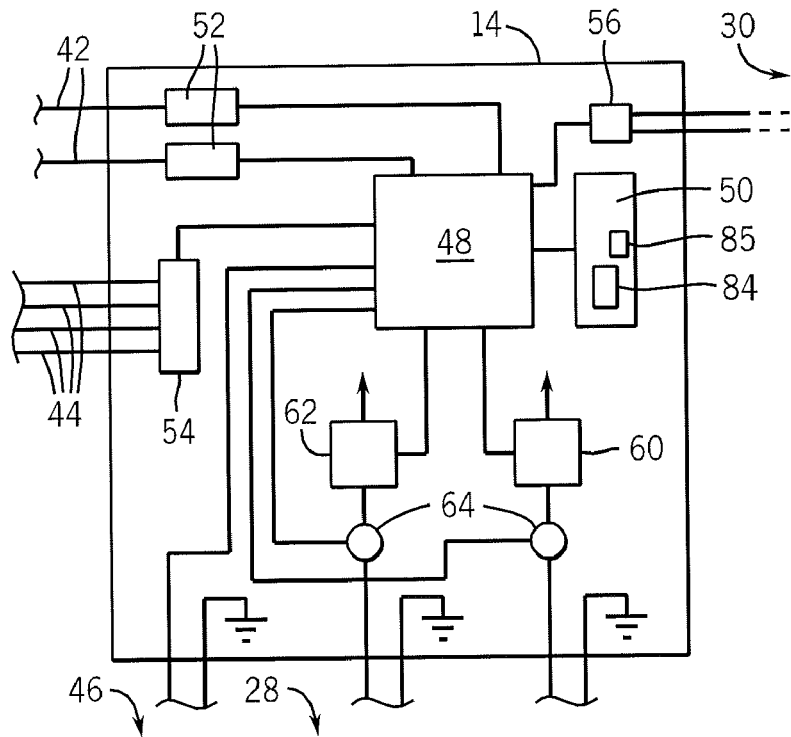
FIG. 3 is a block diagram of the components of the controller of FIG. 1 including a microcontroller independently controlling electrical power to coils of the vacuum contactor.

Referring now to FIG. 3, the vacuum contactor controller 14 may include a microcontroller 48 of a type well known in the art communicating with a nonvolatile memory 50 such as an EEPROM which may hold a stored program executing the steps of controlling the vacuum contactor as will be described below.

Interface leads of the microcontroller 48 may be attached to network interface circuits 52 providing for the communication protocols of the serial communication channels 42, for example, DeviceNet, CAN, or RS-232 or RS-485 protocols. Other interface leads of the microcontroller 48 may be attached to I/O circuitry 54 providing an interface to the I/O lines 44.

A digital input lead of the microcontroller 48 may receive the switching signal from the auxiliary contacts 30 through interface circuitry 56. The electrical signal from the barometric pressure sensor 46 may be received by an internal analog to digital converter in the microcontroller 48.

The microcontroller 48 also provides output signals controlling coil power supplies 60 and 62, the latter receiving conditioned power and providing pulse width modulated (PWM) DC to the coil of electromagnet 28 (and optionally the coil of release electromagnet 40), for example, through the use of an insulated gate bipolar transistor (IGBT) circuit of the type well known in the art. Additional coil power supplies 60 and 62 may be used in controllers controlling vacuum contactor with additional vacuum bottles 15. Current sensors 64 on the output of the power supplies 62 and 60 allow for the measurement of current flow to the coils of electromagnet 28 and 40 by the microcontroller 48 through an internal A/D converter.

The vacuum contactor controller 14 may receive electrical power, for example, 110-240 VAC or 110-250 VDC, which may be conditioned according to methods well known in the art to condition power for operation of these components. The power circuitry is not shown for clarity. In addition, the microcontroller 48 may also connect to panel displays having LEDs or the like for indicating status conditions of the vacuum contactor system 10, for example, a fault condition or the presence or absence of electrical power. The panel displays are not shown but are of a type well known in the art.

Referring now to FIG. 5, when the vacuum contactor controller 14 is initially powered up or after the vacuum contactor controller 14 has been reset, the controller begins execution of a stored program 84 held in memory 50 beginning at process block 66.

After the microcontroller 48 performs standard internal diagnostics, the microcontroller 48 reads and stores the barometric pressure from the barometric pressure sensor 46 as indicated by process block 68. As mentioned above, this barometric pressure will affect the force required to close the contacts 18 and 20.

Figure 4:
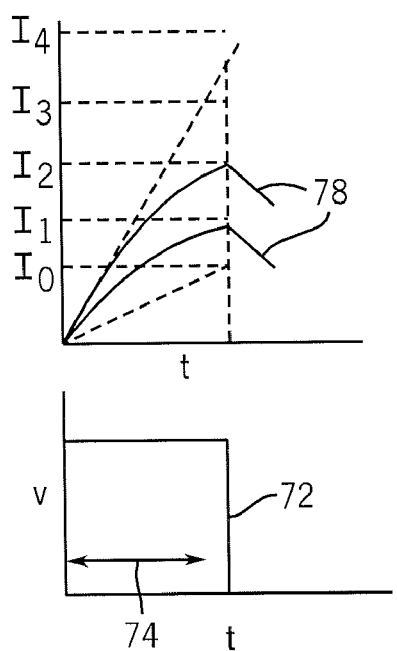
FIG. 4 is a plot of electrical power applied to the coils of the vacuum contact during a test mode, showing voltage and possible current waveforms during a test pulse.

Next, at process block 70, the microcontroller 48 checks the response of any coils attached to its terminals possibly including coils of electromagnet 28 and 40. Referring also to FIG. 4, the checking of coils response may be done by applying a test voltage pulse 72 on each terminal set possibly connected to a coil, using power supply 60 and 62. The voltage pulse 72 will have a predetermined voltage $V_0$ and period of time 74 selected to contain insufficient energy to activate any known coil of electromagnet 28 or 40.

Nevertheless, the voltage $V_0$ of the test voltage pulse 72 will induce a current 78 in any coil of electromagnet 28 or 40 attached to the particular terminals of the microcontroller 48, and this current 78 will rise over time depending on the impendence of the attached coil of electromagnet 28 or 40. At the conclusion of time 74, the peak current 78 is sampled through current sensors 64 and evaluated per decision block 76 against thresholds $I_0$-$I_3$ stored in the memory 50.

$I_0$ is the lowest threshold, and a sampled current at or below $I_0$ indicates that no coil is attached to the particular terminals or else that the coil is open. An internal configuration file in memory 50 (set by the user) is reviewed to see if the vacuum contactor 12 is electrically held or mechanically latched. If the vacuum contactor 12 is electrically held and the terminals exhibiting an open circuit are designated for a coil of release electromagnet 40, no fault is indicated at decision block 76 and the program proceeds to process block 82. Otherwise, if the vacuum contactor 12 is mechanically latched and the terminals exhibiting an open circuit are designated for a coil of release electromagnet 40, or if the vacuum contactor 12 is electrically held and the terminals exhibiting an open circuit are designated for a coil of actuation electromagnet 28, a fault is indicated and a fault condition is generated for the user as indicated by decision block 76 of FIG. 5. In an alternative embodiment, no internal configuration file is used, and the controller assumes that the vacuum contactor 12 is electrically held if there is a high impedance at all terminals designated for coils of release electromagnets 40.

If the sampled current is between $I_0$ and $I_1$, for example, it may be deduced that a coil is present at the terminals having a first impedance, for example, indicating an 800 ampere coil used for high current vacuum contactors. Alternatively this second range may be a window centered on a current $I_1$ admitting the possibility of currents outside of this window and other windows generating a fault as being an unknown coiled type.

If the sampled current is between $I_1$ and $I_2$, for example, it may be deduced that a coil is present at the terminals having a second impedance, for example, indicating a 400 ampere coil used for low current vacuum contactors. Alternatively this second range may be a window centered on a current $I_2$, generating a fault if the current is within no other window.

Finally, a high threshold $I_3$ is established such as is used to indicate a short circuit across the terminals (and hence a shorted coil) if the current exceeds this amount. A fault is also generated in this situation.

$I_4$ represents a current level necessary to activate the coil when applied in sufficient duration and is not exceeded for normal coils of electromagnet 28 or 40.

At decision block 76, the output of the barometric pressure sensor 46 may also be evaluated to see if it outside an expected range of values that would indicate a fault in the barometric pressure sensor 46 or an invalid altitude (being an altitude outside of the correction and/or operating range of the system). In such cases, a fault signal indicating failure of the barometric pressure sensor 46 is generated.

As indicated by decision block 76 any of these fault conditions may result in an output signal that may be used to notify the user of the fault and type of fault as indicated by process block 80. This fault signal may be in the form of one or more indicator lights on the front panel of the vacuum contactor controller 14 or a signal transmitted over one of the serial communication channels 42 to a central controller or the like.

If there is no fault condition at decision block 76, then at process block 82 a steady-state current to be provided to the coils of electromagnet 28 (and 40) when they are to be activated, may be determined. Referring to FIGS. 3 and 6, this process of determining the operating current for a coil of electromagnet 28 may employ a lookup table 85 held in memory 50 and storing a set of empirically derived current values 86 necessary to "pull-in" and "hold" the armature 24 with coil of electromagnet 28 at different barometric pressures. Typically, for example, the pull-in current will be substantially higher than the holding current.

Based on the previously stored barometric pressure and the coil type deduced from the test pulse 72 described above, current values 86 are identified and stored to be used for operation of the coil of electromagnet 28. When the vacuum contactor controller 14 receives an actuation signal, for example, through I/O lines 44 or serial communication channels 42, the microcontroller 48 will control the appropriate coil's power supply 60 or 62 to output an average PWM voltage to the appropriate coil to produce the current value from this table 85. If the vacuum contactor is mechanically latched, only the pull-in current for coil of electromagnet 28 is needed and the holding current may be the pull-in current to be used for coil of release electromagnet 40. Generally the current needed for coil of release electromagnet 40 does not change with changes in barometric pressure.

Referring again to FIG. 5, periodically during operation of the contactor system 10, the coil response may be checked per process block 70, principally to determine if the coils have faulted or shorted during periods of inactivity. In this way the electrical integrity of the vacuum contactors 12 may be better ensured against times when a circuit interruption is required. Failure of this periodic check results in a fault condition being generated.

The present invention has been described in terms of the preferred embodiment, and it is recognized that equivalents, alternatives, and modifications, aside from those expressly stated, are possible and within the scope of the appending claims.

I claim:

1. An electronic controller for an electromagnetically controlled electrical switch comprising:
   a coil power source providing connection points to at least one coil of the electromagnetically controlled electrical switch;
   a test circuit providing an electrical pulse to the coil and monitoring an electrical flow to determine a size of the coil connected to the coil power source; and
   a coil power source controller communicating with the coil power source and the test circuit to receive an actuation signal and to provide a power to the coil based on the actuation signal by controlling the coil power source, the power to the coil automatically selected according to the size of coil determined by the test circuit.

2. The electronic controller of claim 1 wherein the test circuit differentiates between sizes of coils by monitoring current flow after a predetermined period of time under application of a pulse of known voltage to the coil.

3. The electronic controller of claim 1 wherein the pulse of known voltage and predetermined time are selected to prevent activation of the electromagnetically controlled electrical switch for the coil sizes.

4. The electronic controller of claim 1 further including a barometric pressure sensor and wherein the coil power source controller receives a pressure signal from the barometric sensor to provide power to the coil based also on the barometric pressure.

5. The electronic controller of claim 4 wherein the power to the coil is adjusted with barometric pressure according to a function unique to the differentiated coil type.

6. The electronic controller of claim 4 wherein the coil power source controller further generates a fault signal based on the output of the barometric pressure sensor being outside an expected range of values, indicating a fault in the sensor or an invalid altitude.

7. The electronic controller of claim 1 wherein the coil power source controller further generates a fault signal based on electrical flow to the coil exceeding a predetermined value indicating a coil short circuit.

8. The electronic controller of claim 1 wherein the coil power source controller further generates a fault signal based on electrical flow to the coil under a predetermined value indicating a missing or open coil.

9. The electronic controller of claim 1 wherein the coil power source controller further generates a fault signal based on electrical flow to the coil exceeding a predetermined difference from current flow expected of known coils.

10. The electronic controller of claim 1 wherein the test circuit provides a pulse to a coil connected to the connection point upon initialization of the electronic controller before activation of the electromagnetically controlled electric switch.

11. The electronic controller of claim 1 wherein the test circuit provides a pulse to the coil connected to the connection point on periodic intervals during operation of the electronic controller.

12. The electronic controller of claim 1 wherein the test circuit and the coil power source controller are implemented at least in part by a common microcontroller.

13. The electronic controller of claim 1 wherein the coil power source is a switched power supply.

14. The electronic controller of claim 1 wherein the test circuit employs a controllable power source to deliver the electrical pulse to the coil.

15. A vacuum contactor system comprising:
    a vacuum contactor having an actuation coil;
    a controllable power source connected to the actuation coil to provide an actuation power actuating the vacuum contactor in a first mode and a test power to the actuation coil not actuating the vacuum contactor in a second mode; and
    a control system monitoring the test power to the actuation coil during the second mode to deduce electrical characteristics of the actuation coil so as to vary application of power to the actuation coil during the first mode.

16. The electronic controller of claim 14 further including a barometric pressure sensor and wherein the control system receives a pressure signal from the barometric sensor to vary the application of power to the actuation coil based also on the barometric pressure.

17. The electronic controller of claim 14 wherein the controllable power source operates to periodically apply power to the actuation coil in the second mode and wherein the control system further detects a fault condition and generates a fault signal based on electrical flow to the actuation coil indicating at least one of the fault conditions of a short circuit of the actuation coil, an open circuit of the actuation coil, and an actuation coil differing from known electrical characteristics.

18. An electronic controller for an electromagnetic switch having an actuation coil, the electronic controller comprising:
    a power supply;
    a solid-state power controller communicating between the power supply and the actuation coil;
    an electrical sensor sensing at least one of voltage and current provided to the actuation coil by the solid-state power controller;
    a control circuit receiving signals from the electrical sensor to control the solid-state power controller to:
    (1) pulse the actuation coil without actuating the electromagnetic switch and monitoring the signals from the electrical sensor to deduce the electrical properties of the actuation coil; and
    (2) during actuation of the electromagnetic switch, a control power applied to the actuation coil according to the deduced electrical properties of the actuation coil.

19. The electronic controller of claim 17 further including a barometric pressure sensor and wherein the control circuit receives a pressure signal from the barometric sensor to control power to the actuation coil based also on the barometric pressure.

20. The electronic controller of claim 17 wherein the control circuit operates to periodically pulse the actuation coil without actuating the electromagnetic switch, and to monitor the signals from the electrical sensor to deduce the electrical properties of the actuation coil pulse to further detect a fault condition and generate a fault signal based on electrical flow to the actuation coil indicating at least one of the conditions of a short circuit of the actuation coil, an open circuit of the actuation coil, and an actuation coil differing from know electrical characteristics.

* * * * *